United States Patent [19]

Hill

[11] Patent Number: 5,010,543
[45] Date of Patent: Apr. 23, 1991

[54] OPTICAL MULTIPLEXING

[75] Inventor: Alan M. Hill, Stowmarket, England

[73] Assignee: British Telecommunications public limited company, London, England

[21] Appl. No.: 312,706

[22] PCT Filed: Jun. 13, 1988

[86] PCT No.: PCT/GB88/00460

§ 371 Date: Feb. 7, 1989

§ 102(e) Date: Feb. 7, 1989

[87] PCT Pub. No.: WO88/10037

PCT Pub. Date: Dec. 15, 1988

[30] Foreign Application Priority Data

Jun. 12, 1987 [GB] United Kingdom ............... 8713794

[51] Int. Cl.$^5$ ............................................. H04J 14/00
[52] U.S. Cl. ........................................... 370/3; 370/4; 370/1
[58] Field of Search ............ 370/3, 1, 4, 50, 70; 455/605, 610, 611, 612

[56] References Cited

U.S. PATENT DOCUMENTS

| | | | |
|---|---|---|---|
| 4,467,468 | 8/1984 | Miller | 370/3 |
| 4,704,715 | 11/1987 | Shibazaki et al. | 370/3 |
| 4,726,010 | 2/1988 | Ali et al. | 370/3 |

FOREIGN PATENT DOCUMENTS

| | | |
|---|---|---|
| 0033237 | 1/1981 | European Pat. Off. . |
| 0164652 | 5/1985 | European Pat. Off. . |
| 2181921 | 4/1987 | United Kingdom . |
| 88/05233 | 7/1988 | World Int. Prop. O. ............... 370/4 |

OTHER PUBLICATIONS

Electronics Letters, vol. 20, No. 10, May 10, 1984, (London, GB), N. A. Olsson et al: "2 Gbit/s Operation of Single-Longitudinal-Mode 1.5 um Double-Channel Planar Buried-Heterostructure C$^3$ Lasers", pp. 395-397.

Summaries of Technical Papers of the Optical Fiber Communication Conference, Feb. 24-26, 1986, (Atlanta, Georgia, U.S.), W. T. Tsang: "Single-Frequency Semiconductor Lasers?", pp. 14-16.

Technical Digest—Western Electric, No. 72, Oct. 1983, (New York, U.S.), P. S. Henry et al: "Multiplexer Using Coupled-Cavity Laser", p. 19.

Primary Examiner—Reinhard J. Eisenzopf
Assistant Examiner—Kinfe-Michael Negash

[57] ABSTRACT

An optical signal is multiplexed for use in a network including a control station, a high data rate optical path connecting the control station to a mode and low data rate optical paths extending from the node to receiving stations. The method of multiplexing includes repeatedly sweeping the source of the optical signal over a wide wavelength range such that a distinct wavelength channel is provided for each receiving station. The sweep rate is equal to the low data rate. At the node, the signal is resolved into constituent wavelength channels having distinct time slots and transmitted via respective low data rate optical paths to the receiving stations.

17 Claims, 3 Drawing Sheets

OPTICAL MULTIPLEXING

The present invention relates to a method of dividing an optical signal into a number of distinct channels for transmission to different receiving stations and a network employing such a system. Such a method may be used for telephony or for other forms of data transmission.

A typical network to which the present invention might be applied comprises a central control station, a single fibre transmission line linking the control station to a node and a large number of fibre transmission lines extending from the node to individual subscriber stations. To spread the capital cost of the optical system up to and including the node as widely as possible it is desirable to spread the equipment cost between users and where necessary maximize the number of subscribers connected to a given node. In practice time division multiplexing can be used to connect as many as a thousand subscribers to one node. As a result even though the data transmission rates between one subscriber and the node may be comparatively low the data transmission rate between the node and the control station needs to be very much higher if the node is not to act as a data "bottleneck". With conventional methods of time division multiplexing the complexity of the equipment required at the node and/or at each subscriber station to cope with the assembly/disassembly of many multiplexed channels and the conversion between high and low data rates is such that it brings severe disadvantages in terms of cost and reliability. This significantly reduces and in some cases eliminates altogether the advantages achieved in the first place by connecting many customers to a single node.

According to one aspect of the present invention an optical encoder for an optical communications system comprises an optical source for generating an optical signal corresponding to a received time-domain mulitplexed signal of two or more information channels having a tuning means arranged to vary the wavelength of the optical signal so that those portions of the optical signal corresponding to a respective distinct channel are generated at a distinct wavelength.

The present invention provides a time division multiplexed optical signal in which each channel is encoded into a wavelength multiplex using only one optical source for all the channels avoiding the requirement for mulitple optical sources, i.e. one per channel as required, for example, in the system described by Miller in U.S. Pat. No. 4,467,468. A further advantage of the present invention is that it does not require the channels to be interleaved bit by bit but can be employed to wavelength encode asynchronous channels of variable bit length section.

An encoder according to the first aspect of the present invention finds application in an optical communications system according to the second aspect of the present invention, namely in an optical communications system having a control station, a first optical path connecting the control station to a node and secondary optical paths connecting the node to two or more receiving stations including an optical encoder: according to the first aspect of the present invention; a first transmitting means for transmitting the optical signal from the control station via the first optical path to the node; a passive wavelength analyser at the node arranged to direct respective wavelength channels via the secondary optical paths to the receiving stations.

Where the time domain multiplex signal has channels which are bit interleaved the encoder is preferably arranged to repeatedly sweep the optical frequency through a preselected wavelength range. The rate of sweep is chosen such that each channel bit is coded to a distinct wavelength, the process being repeated each set of interleaved channel bits. However, the present invention in its broader aspect does not require the wavelengths for each successive channel to be in any order. The turning means may select wavelength in any order as will be required for the more general asynchronous time domain multiplexed described above.

For the bit interleaved time domain multiplex signal using a combination of time division multiplexing and wavelength division multiplexing the present invention can provide a high data rate between the control station and the node through the use of a wide bandwidth with many wavelength channels and a low data rate between the node and each receiving station through the use of a narrow optical bandwidth and a single wavelength channel without requiring active processing to convert between different sampling rates. Since the time division multiplexing/demultiplexing occurs at the control station and the time slot are wavelength encoded the node need only have passive wavelength resolving equipment. The use of a method in accordance with the present invention therefore allows the construction of an optical network with significant advantages in terms of cost and reliability. It can be used simply to provide each receiving station with a signal for modulation and retransmission but may readily be adapted to transmit data to the receiving stations in addition.

Preferably the system further comprises modulating the received signal at one or more of the receiving stations at the low data rate and returning the modulated signal via the node through the high data rate optical path to the control station. Preferably one or more of the channels is pulse code modulated at the control station with non-zero logic levels and at the respective subscriber station the received optical power is split, part of the power being directed to a demodulator and part of the power being modulated and retransmitted by the receiving station. Alternatively the method may further comprise transmitting a signal from one or more of the receiving stations to the node to modulate the respective one or more wavelength channels at the node for retransmission from the node to the control station.

By modulating the signal to be transmitted at the node rather than at the receiving station the present invention not only reduces the complexity and cost of the equipment required by each receiving station but also eliminates the difficulty of retaining different channels in their correct time slots when different receiving stations are at different distances from the node. This problem does not arise when the channels are modulated and reflected at the node at a single fixed distance from the controlling station. The present invention offers further advantages in terms of data security since each receiving station has access only to the data intended for it.

According to a further aspect of the present invention a method of optically encoding a received time domain multiplexed signal of two or more information channels comprising generating an optical signal corresponding to the received signal by means of a wavelength tunable optical source while varying the wavelength of the optical signal so that those portions of the optical signal corresponding to respective distinct channels are generated at distinct wavelengths.

According to a yet further aspect of the present invention a method of communication comprises:
optically encoding a time domain multiplexed signal of two or more information channels as an optical signal at a control station;
transmitting the optical signal to a node;
resolving the optical signal into its constituent wavelength portions at the node;
transmitting the different wavelength portions to respective receiving stations.

Preferably the node further includes a spatial light modulator and a mirror arranged in the passive wavelength analyser to modulate and reflect back to the control station one or more wavelength channels in response to signals from the respective one or more receiving stations. Preferably the source of light is a semiconductor laser and the means to sweep the light periodically through a wide wavelength range includes a tunable external optical cavity.

A method and a system in accordance with the present invention are now described in detail with reference to the accompanying drawings, in which.

Figure 1:
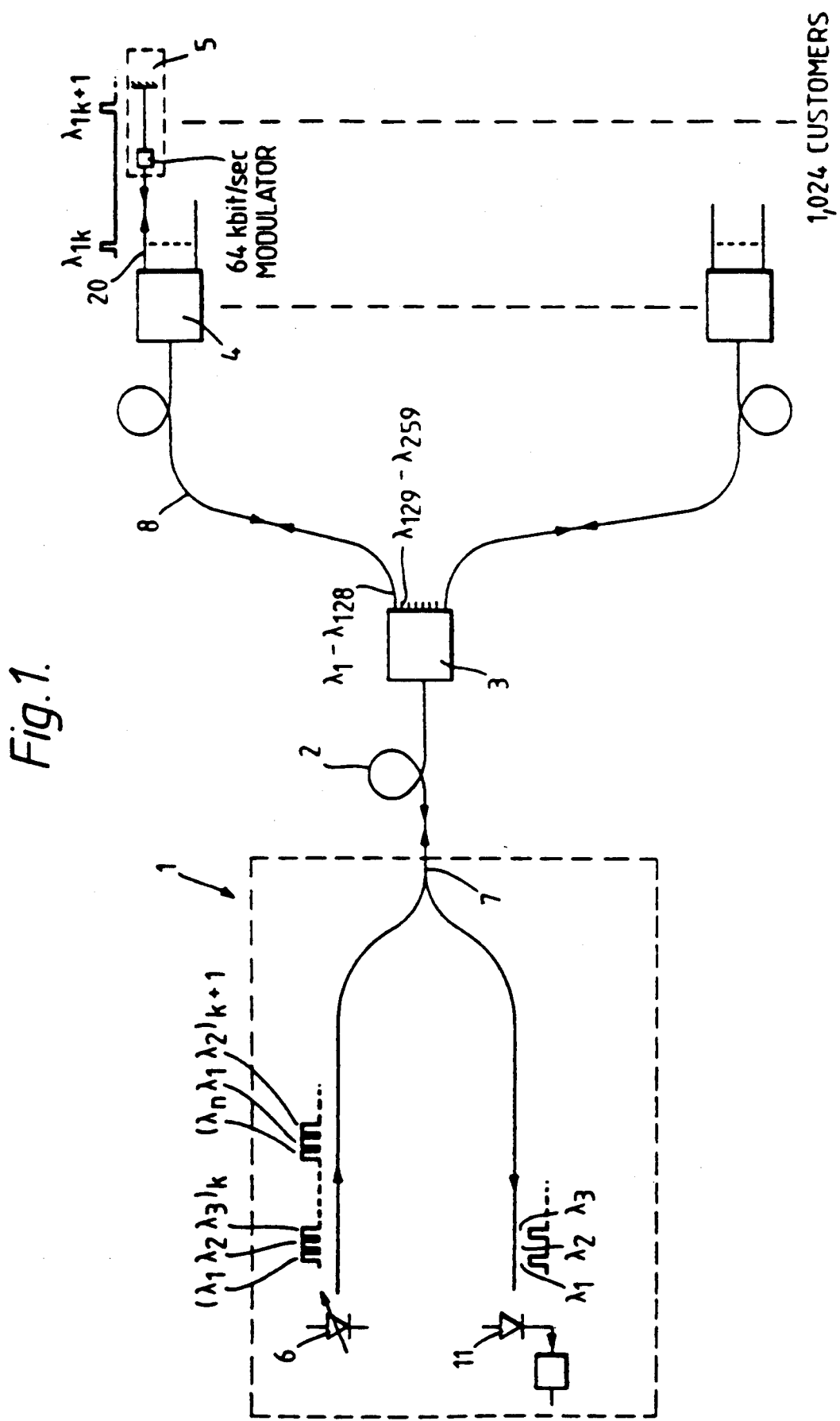
FIG. 1 is a diagram illustrating a method and system in accordance with the present invention.

In the system shown in FIG. 1; a controlling station 1 is connected via a wide bandwidth optical fibre 2 to a node 3. The node 3 is in turn connected to a series of further nodes 4 from which fibres carrying narrow optical bandwidths 20 extend to receiving stations 5.

The control station 1 includes a semiconductor laser 6 which provides the optical power for the system. The semiconductor laser 6 is modulated to provide time-division multiplexed channels in a conventional fashion. In addition an external optical cavity is used to sweep the output of the laser 6 through a range of frequencies such that each successive time-division channel occupies a distinct wavelength channel ($\lambda_1, \lambda_2 \ldots \lambda_n$). The frequency sweep is repeated at a rate equal to the data rate desired for transmission along the low bit rate fibres, 64 KHz in the case of the system illustrated. Although handling only a narrow optical bandwidth the low bit rate fibres have a sufficiently broad electrical bandwidth to transmit narrow pulses without significant spreading. A delay may be included before each successive sweep to allow for differential delays within the system as a result of dispersion: a 15 nsec delay is sufficient for a total signal path of 7 km. It is found to be possible to resolve channels with a wavelength spacing of 0.1 nanometers: sweeping the laser through a wavelength range of 100 nanometers can therefore provide more than 100 distinct wavelength channels. Thus although the system uses a relatively low sampling rate of 64 KHz the output from the control station 1 which is joined to the fibre 2 by an optical coupler 7 can have a data rate as high as 65.5 Mbit/s (1,024×64 kbit/s) in the case of a 1,024 channel system.

Since each channel in the data stream leaving the control station 1 occupies a distinct wavelength channel the data stream may be demultiplexed using a simple passive wavelength analyser and without the use of active electronic devices. FIG. 1 shows a two stage demultiplexing system. The high data rate (broad bandwidth) data stream on the fibre 2 is taken first to the node 3 which analyses the wide-bandwidth signal into eight reduced bandwidth groups each containing 128 of the original channels. Each of the eight groups is output from the node 3 to one of eight reduced bandwidth fibres 8. Each of the reduced bandwidth fibres 8 leads to a further node 4 (all but two of the reduced bandwidth fibres 8 and the nodes 4 are omitted from FIG. 1 for clarity). Each of the nodes 4 contains an analyser which splits the reduced bandwidth group into its constituent wavelength channels and outputs each channel along a separate narrow bandwidth (low data rate) fibre 20 to one of 1,024 receiving stations 5 (all but one of the receiving stations 5 are omitted for clarity).

Figure 2:
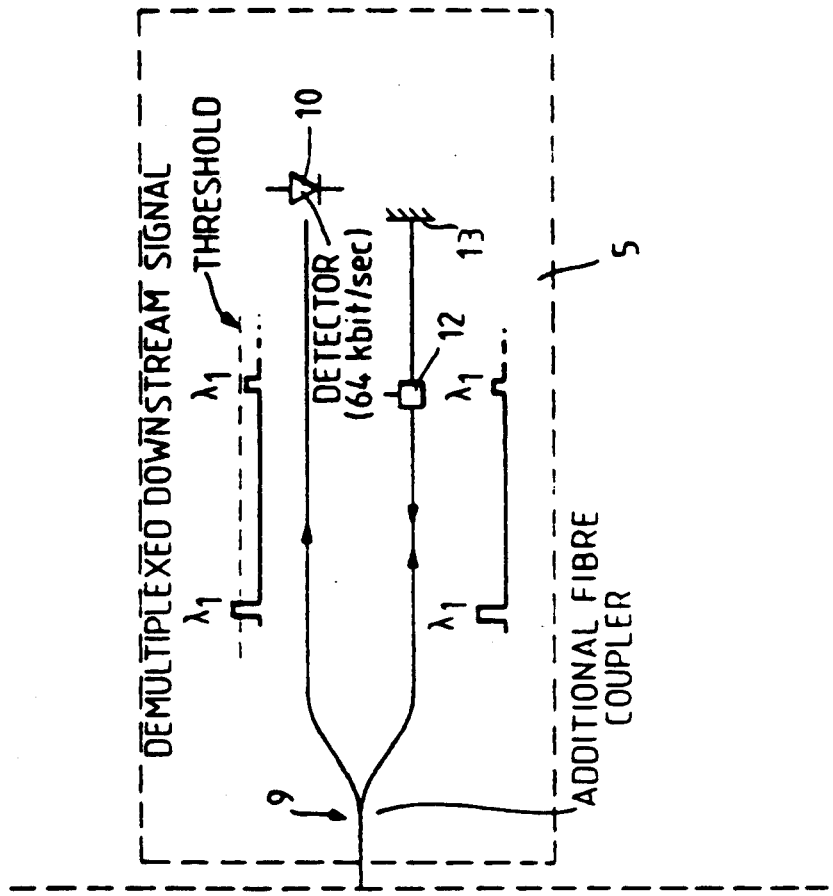
FIG. 2 is a diagram illustrating modulation/demodulation methods for use in a method or system in accordance with the present invention; and, FIG. 3 is a diagram illustrating modulators/analysers for use in a method or system in accordance with the present invention.
Figure 2:
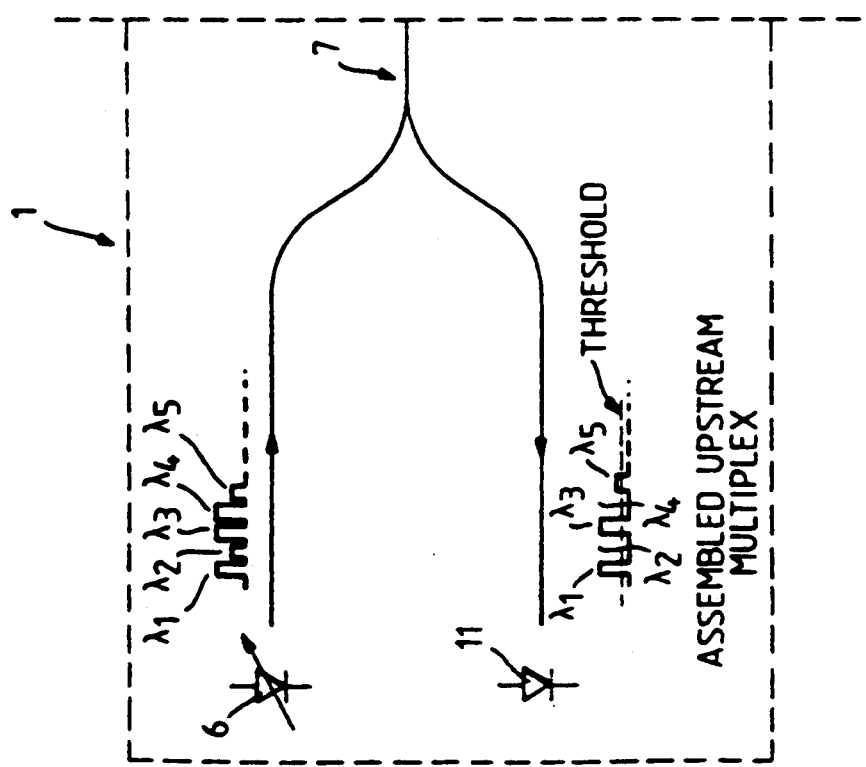

Each of the receiving stations is arranged both to detect a signal modulated on its respective channel using a receive operating at the low data rate and to impose further modulation on the respective channel for transmission back to the control station. The modulation/demodulation scheme used is illustrated diagrammatically in FIG. 2. A signal is imposed upon one or more of the channels at the control station using binary pulse code modulation techniques. Since the receiving stations do not themselves contain any source of optical power it is necessary to maximize the power transmitted to them. To this end the pulse code modulation uses two non-zero logic levels rather than conventional "on-off" coding to avoid the loss of power which would otherwise occur as a result of the modulation to the zero level. Each receiving station 5 includes an additional fibre coupler 9 which splits the light in two, part of the light being used for detection of the modulated signal using a threshold detector 10 the remaining optical power being used for modulation by a modulator 12, reflection by a mirror 13 and retransmission to the control station 1. At the control station 1 the optical signal is received by a detector 11 and the signal decoded by a receiver having a data rate of at least 65.5 Mbit/s. This use of pulse code modulation followed by splitting at the receiving station 5 results in a 6 dB power loss in the path from the control station 1 to the receiving station detector 10: 3 dB due to the use of the half power level for the "off" state plus a further 3 dB loss at the coupler. In a signal reflected to the control station from the receiving station there are two passes through the extra coupler 9 and hence a 9 dB loss overall assuming a 50:50 coupler ratio. This additional loss of 9 dB may be reduced by employing a coupler with an equal coupling ratio since less attenuation is incurred in the path from the receiving station 5 to the control station 1 and the receiving station has in any case higher sensitivity. Other elements of the system also contribute to power losses: tables 1 and 2 show overall power budgets for transmission from the control station 1 to the receiving station 5 and transmission from the control station 1 to the receiving station 5 and back to the control station 1 respectively.

TABLE 1

| DOWNSTREAM POWER BUDGET | | |
|---|---|---|
| Launch Power | | 0 dB |
| Sensitivity at 64 kbit/sec | | −70 dB |
| Available system loss | | 70 dB |
| coupler (50:50) | 3 dB | |

TABLE 1-continued
DOWNSTREAM POWER BUDGET

| | | | |
|---|---|---|---|
| Fibre (3.5 km) | 2.5 | dB | |
| 1st stage MUX | 6 | dB | |
| 2nd stage MUX | 6 | dB | |
| Coupler (90:10) | 10 | dB | |
| Penalty for non-zero off-state | 3 | dB | |
| Signal reduction through 64 KHz filter | 30 | dB | |
| System loss | 60.5 | dB | 60.5 dB |
| System margin | | | 9.5 dB |

TABLE 2
UPSTREAM POWER BUDGET (INDIVIDUAL MODULATORS PER CUSTOMER)

| | | | |
|---|---|---|---|
| Launch power | | | 0 dB |
| Sensitivity at 65.5 Mbit/sec | | | −49 dB |
| Available system loss | | | 49 dB |
| Coupler (50:50) | 3 | dB | |
| Fibre | 2.5 | dB | |
| 1st stage MUX | 6 | dB | |
| 2nd stage MUX | 6 | dB | |
| Coupler (90:10) | 0.5 | dB | |
| Modulator/Reflector | 2 | dB | |
| 2nd stage MUX | 6 | dB | |
| 1st stage MUX | 6 | dB | |
| Fibre | 2.5 | dB | |
| Coupler (50:50) | 3 | dB | |
| Penalty for non-zero off-state | 3 | dB | |
| System loss | 40.5 | dB | 40.5 dB |
| System margin | | | 8.5 dB |

Figure 3:
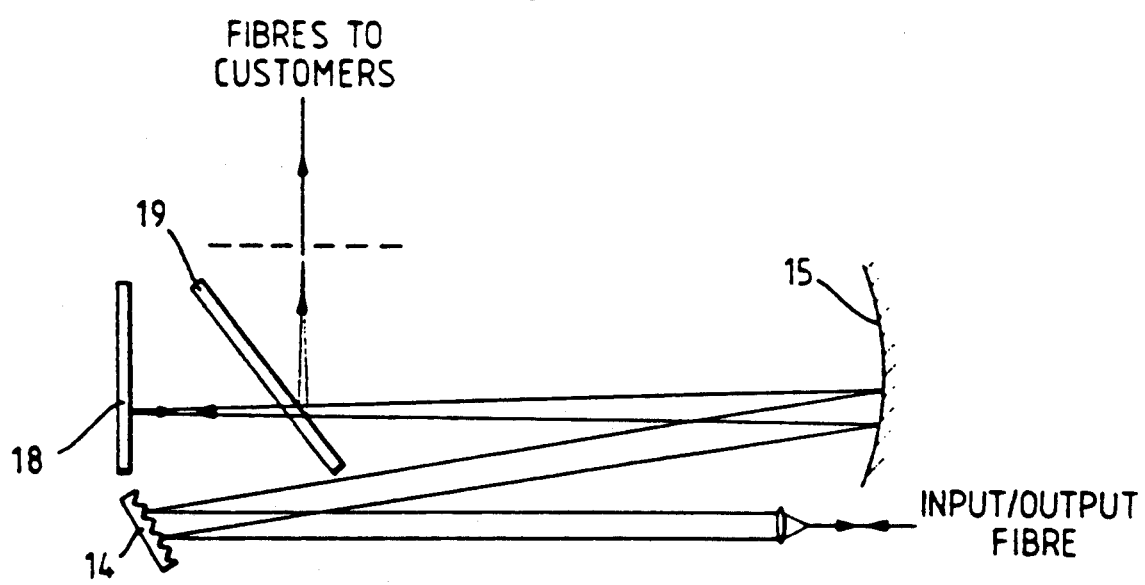

In an alternative embodiment of the present invention modulation of the light for retransmission to the control station 1 takes place not at the individual receiving stations 5 but at the nodes 4. In this case the wavelength analysers in the nodes 4 include optical modulators as shown in FIG. 3. In common with the simple analysers discussed above the analyser/modulators include a reflection diffraction grating 14 and a concave mirror 15 arranged to direct each distinct wavelength to a unique point in space for coupling to a particular fibre. However in addition the analyser/modulator of FIG. 3 includes a spatial light modulator (SLM) 18. The SLM 18 may be transmissive (e.g. a magneto-optic cell or liquid crystal structure) in which case a mirror (not shown) is positioned adjacent its rear surface to reflect the incident light. Alternatively the SLM 18 may be inherently reflective (e.g. a silicon micro-machined surface). A beam splitter 19 directs part of the light to fibers connected to the receiving stations and the remainder to the SLM 18. Incoming rays from the control station 1 are analysed and directed to the appropriate receiving stations as normal. However instead of the receiving stations being arranged to modulate and retransmit a portion of the light received each receiving station is connected electrically to the point on the array of the SLM 18 corresponding to its wavelength channel and as a result controls the modulation of that portion of the light which is reflected back to the control station 1 from the SLM 18.

The network can be upgraded easily to continuous wave wideband operation in the same customer wavelength channels by coupling in additional multiplexed laser signals.

Where the present invention is to be used to optically encode an asynchronous time domain multiplexed signal the tuning of the optical source 6 is controlled to vary with the timing of the various channels which may be irregular both in the periods of time the optical source is set to a given wavelength and in the order the wavelengths are set which order will depend on the order of the channels in the received time domain multiplex.

The secondary optical paths may be replaced by electrical connections between the node and the receiving stations.

What is claimed is:

1. An optical encoder for an optical communications system comprising:
   an optical source for generating an optical signal corresponding to an input time-domain multiplexed signal of two or more information channels separated in the time domain and having a tuning means arranged to vary the wavelength of the optical signal as a function of time so that those portions of the optical signal corresponding to a respective distinct time domain multiplexed channel are generated at a predetermined wavelength.

2. An optical encoder as in claim 1 in which the optical source is a semiconductor laser including a tunable external optical cavity.

3. An optical encoder for an optical communications system comprising an optical source for generating an optical signal corresponding to a time-domain multiplexed signal of two or more information channels having a tuning means arranged to vary the wavelength of the optical signal so that those portions of the optical signal corresponding to a respective distinct channel are generated at a distinct wavelength; and
   wherein the tuning means is arranged to repeatedly sweep the optical signal through a preselected wavelength range.

4. An optical communications system having a control station, a first optical path connecting the control station to a node and secondary optical paths connecting the node to two or more receiving stations including:
   an optical encoder for an optical communications system comprising an optical source for generating an optical signal corresponding to a time-domain multiplexed signal of two or more information channels having a tuning means arranged to vary the wavelength of the optical signal so that those portions of the optical signal corresponding to a respective distinct channel are generated at a distinct wavelength;
   a first transmitting means for transmitting the optical signal from the control station via the first optical path to the node; and
   a passive wavelength analyser at the node arranged to direct respective wavelength channels via the secondary optical paths to the receiving stations.

5. An optical communications system as claimed in claim 4 in which one or more of the receiving stations includes a modulating means whereby the optical signal received from the node can be modulated and returned to the control station via the node.

6. An optical communications system as claimed in claim 5 in which the optical encoder generates a pulse code modulated optical signal with non-zero logic levels.

7. An optical communications system according to claim 4 further comprising:
   means to transmit a signal from one or more of the receiving stations to the node, and
   node modulating means at the node for modulating the respective one or more wavelength channels at the node for retransmission from the node to the control station.

8. A method of optically encoding an input time domain multiplexed signal of two or more information channels separated in the time domain, said method
generating an optical signal corresponding to the input signal by means of a wavelength tunable optical source while varying the wavelength of the optical signal as a function of time so that those portions of the optical signal corresponding to respective distinct time domain multiplexed channels are generated at predetermined wavelengths.

9. A method of optically encoding an input time domain multiplexed signal of two or more information channels comprising:
generating an optical signal corresponding to said input signal by means of a wavelength tunable optical source by varying the wavelength of the optical signal so that those portions of the optical signal corresponding to respective distinct channels are generated at distinct wavelengths,
wherein the wavelength of the optical signal is repeatedly swept through a preselected wavelength range.

10. A method of communication comprising:
optically encoding an input time domain multiplexed signal of two or more information channels as an optical signal at a controls station by generating an optical signal corresponding to said input signal by means of a wavelength tunable optical source while varying the wavelength of the optical signal so that those portions of the optical signal corresponding to respective distinct channels are generated at distinct wavelengths,
transmitting the optical signal to a node,
resolving the optical signal into its constituent wavelength portions at the node, and
transmitting the different wavelength portions to respective receiving stations.

11. A method of communication as claimed in claim 10 further comprising modulating the signal received at one or more of the receiving stations and returning the modulated signal via the node to the control station.

12. A method of communication as in claim 11 in which the portion of the optical signal corresponding to the information channels is pulse code modulated at the control station with non-zero logic levels and each corresponding receiving station includes a demodulator.

13. A method of communication as in claim 12, in which at each corresponding receiving station the received optical power is split, part of the power being directed to the demodulator and part of the power being demodulated and retransmitted by the receiving station to the control station via the node.

14. A method of communication as in claim 10 further comprising transmitting a signal from one or more of the receiving stations to the node to modulate the respective one or more wavelength channels returned to a the node for retransmission via the node to the control station.

15. An optical communications system having:
a control station,
a first optical path connecting the control station to a node and secondary optical paths connecting the node to two or more receiving stations;
said control station including an optical encoder having an optical source for generating an optical signal corresponding to a time-domain multiplexed signal of two or more information channels with a tuning means arranged to vary the wavelength of the optical signal so that those portions of the optical signal corresponding to a respective distinct channel are generated at a distinct wavelength;
a first transmitting means for transmitting the optical signal from the controls station via the first optical path to the node; and
a passive wavelength analyser at the node arranged to direct respective wavelength channels to optical detectors the electrical outputs of which are transmitted to the receiving stations.

16. An optical encoder for an optical communications systems, said encoder comprising:
a wavelength tunable optical signal source capable of generating optical output signals at n predetermined wavelengths $\lambda_1, \lambda_2, \ldots \lambda_n$;
said tunable optical signal source being driven by an input time-domain multiplexed signal having n time-domain multiplexed information channels $TDC_1, TDC_2, \ldots TDC_n$ such that the optical signal source operates at predetermined wavelength $\lambda_i$ during a time slot assigned to a respectively corresponding time-domain multiplexed channel $TDC_i$, i being an integer in the range of 1 to n; and
an optical output signal conduit disposed to carry optical output signals generated by said tunable optical signal source.

17. A method of encoding n input signals onto an optical signal conduit, said method comprising the steps of:
time-division multiplexing said n input signals to produce a time-division multiplexed signal with n channels;
driving a wavelength tunable optical signal source with said time-division multiplexed signal to produce a wavelength-division and time-multiplexed optical output signal carrying the information content of a given predetermined one of said input signals in a predetermined time multiplexed channel at a corresponding predetermined optical wavelength.

* * * * *